(12) United States Patent
Petersson et al.

(10) Patent No.: US 10,763,592 B2
(45) Date of Patent: Sep. 1, 2020

(54) ANTENNA ARRANGEMENTS FOR A RADIO TRANSCEIVER DEVICE

(71) Applicant: TELEFONAKTIEBOLAGET LM ERICSSON (PUBL), Stockholm (SE)

(72) Inventors: Sven Petersson, Sävedalen (SE); Andreas Nilsson, Göteborg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 534 days.

(21) Appl. No.: 15/543,539

(22) PCT Filed: Jun. 27, 2017

(86) PCT No.: PCT/EP2017/065925
§ 371 (c)(1),
(2) Date: Jul. 13, 2017

(87) PCT Pub. No.: WO2019/001693
PCT Pub. Date: Jan. 3, 2019

(65) Prior Publication Data
US 2018/0375221 A1 Dec. 27, 2018

(51) Int. Cl.
*H01Q 21/24* (2006.01)
*H01Q 3/24* (2006.01)
(Continued)

(52) U.S. Cl.
CPC ......... *H01Q 21/245* (2013.01); *H01Q 1/246* (2013.01); *H01Q 3/24* (2013.01); *H01Q 3/247* (2013.01);
(Continued)

(58) Field of Classification Search
CPC .... H04B 7/04; H04B 7/0686; H01Q 5/00–55; H01Q 21/24–30
See application file for complete search history.

(56) References Cited

U.S. PATENT DOCUMENTS

2003/0109283 A1    6/2003  Shapira et al.
2013/0147664 A1*   6/2013  Lin ................... H01Q 25/00
                                                    342/372
(Continued)

FOREIGN PATENT DOCUMENTS

WO       200039943 A1    7/2000

OTHER PUBLICATIONS

International Preliminary Report on Patentability, issued in corresponding International Application No. PCT/EP2017/065925, dated Sep. 17, 2019, 8 pages.
(Continued)

*Primary Examiner* — Ricardo I Magallanes
(74) *Attorney, Agent, or Firm* — Rothwell, Figg, Ernst & Manbeck, P.C.

(57) ABSTRACT

There is provided an antenna arrangement for a radio transceiver device. The antenna arrangement comprises at least two antenna arrays, wherein at least one of the at least two antenna arrays has antenna elements of two polarizations. The antenna elements of one polarization at each of the at least two antenna arrays define a respective set of antenna elements. The antenna arrangement comprises at least two baseband chains. The antenna arrangement comprises a switching network configured to selectively operatively connect each of the at least two baseband chains with its own set of antenna elements such that no two baseband chains are operatively connected to one and the same set of antenna elements. Each of the at least one antenna array that has antenna elements of two polarizations is operatively connected to the switching network via a respective hybrid connector configured to provide a signal from one of the baseband chains to antenna elements of both polarizations.

25 Claims, 5 Drawing Sheets

(51) Int. Cl.
*H03F 3/189* (2006.01)
*H01Q 21/28* (2006.01)
*H01Q 1/24* (2006.01)
*H01Q 3/26* (2006.01)

(52) U.S. Cl.
CPC ............... *H01Q 3/26* (2013.01); *H01Q 21/28* (2013.01); *H03F 3/189* (2013.01); *H03F 2200/294* (2013.01); *H03F 2200/451* (2013.01)

(56) References Cited

U.S. PATENT DOCUMENTS

2016/0365900 A1* 12/2016 Kim ..................... H04B 7/0408
2017/0155197 A1* 6/2017 Wong ....................... H01Q 1/32

OTHER PUBLICATIONS

International Search Report and the Written Opinion of the International Searching Authority, issued in corresponding International Application No. PCT/EP2017/065925, dated Mar. 9, 2018, 14 pages.

* cited by examiner

ANTENNA ARRANGEMENTS FOR A RADIO TRANSCEIVER DEVICE

CROSS REFERENCE TO RELATED APPLICATION(S)

This application is a 35 U.S.C. § 371 National Phase Entry Application from PCT/EP2017/065925, filed Jun. 27, 2017, designating the United States, the disclosure of which is incorporated herein in its entirety by reference.

TECHNICAL FIELD

Embodiments presented herein relate to a method, a radio transceiver device, a computer program, and a computer program product for operating an antenna arrangement for transmission of a signal. Embodiments presented herein further relate to a method, a radio transceiver device, a computer program, and a computer program product for operating an antenna arrangement for reception of a signal.

BACKGROUND

In communications networks, there may be a challenge to obtain good performance and capacity for a given communications protocol, its parameters and the physical environment in which the communications network is deployed.

For example, for future generations of mobile communications systems frequency bands at many different carrier frequencies could be needed. For example, low such frequency bands could be needed to achieve sufficient network coverage for terminal devices and higher frequency bands (e.g. at millimeter wavelengths (mmW), i.e. near and above 30 GHz) could be needed to reach required network capacity. In general terms, at high frequencies the propagation properties of the radio channel are more challenging and beamforming both at the network node at the network side and at the terminal devices at the user side might be required to reach a sufficient link budget.

The terminal devices and/or the transmission and reception point (TRP) of the network node could implement beamforming by means of analog beamforming, digital beamforming, or hybrid beamforming. Each implementation has its advantages and disadvantages. A digital beamforming implementation is the most flexible implementation of the three but also the costliest due to the large number of required radio chains and baseband chains. An analog beamforming implementation is the least flexible but cheaper to manufacture due to a reduced number of radio chains and baseband chains compared to the digital beamforming implementation. A hybrid beamforming implementation is a compromise between the analog and the digital beamforming implementations. As the skilled person understands, depending on cost and performance requirements of different terminal devices, different implementations will be needed.

Figure 1:
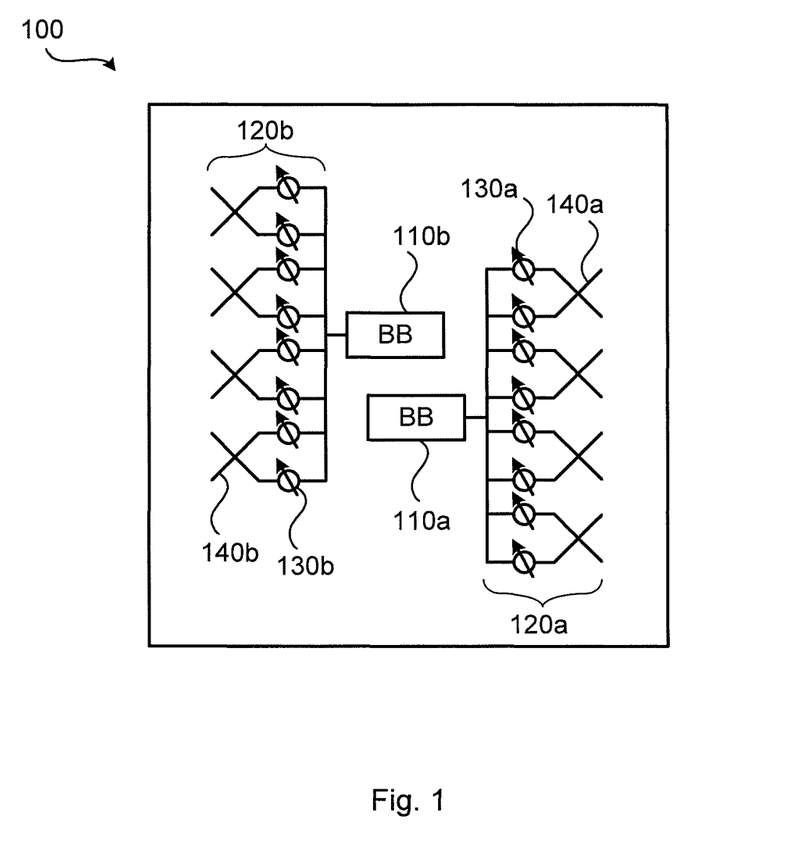
FIG. 1 schematically illustrates a radio transceiver device and its antenna arrangement according to state of the art.

For terminal devices the incoming signals might arrive from all different directions. Hence it is beneficial to have an antenna implementation at the terminal devices which has the possibility to generate omni-directional-like coverage in addition to the high gain narrow beams. One way to increase the omni-directional coverage at the terminal devices is to install multiple antenna arrays, and point the antenna arrays in mutually different directions. FIG. 1 schematically illustrates a terminal device 100 comprising an antenna arrangement having two antenna arrays 120a, 120b, each comprising antenna elements 140a, 140b and phase shifters 130a, 130b. Each antenna array 120a, 120b is operatively connected to its own baseband (BB) chain 110a, 110b. As the skilled person understands, the terminal device 100 could be provided with further antenna arrays, each having its own baseband chain, and each pointing in its own direction in order to further increase the omni-directional coverage. However, in order to limit the heat generated by the antenna arrangement the number of baseband chains should be kept small, for example by limiting the number of baseband chains to just two baseband chains.

With only two baseband chains, it could be challenging to design an antenna arrangement with high flexibility with respect to coverage and capacity (i.e. an antenna arrangement capable of generating both narrow beams and wide beams pointing different directions).

SUMMARY

An object of embodiments herein is to provide antenna arrangements that mitigate the deficiencies noted above and thus enable high flexibility with respect to coverage and capacity.

According to a first aspect there is presented an antenna arrangement for a radio transceiver device. The antenna arrangement comprises at least two antenna arrays, wherein at least one of the at least two antenna arrays has antenna elements of two polarizations. The antenna elements of one polarization at each of the at least two antenna arrays define a respective set of antenna elements. The antenna arrangement comprises at least two baseband chains. The antenna arrangement comprises a switching network configured to selectively operatively connect each of the at least two baseband chains with its own set of antenna elements such that no two baseband chains are operatively connected to one and the same set of antenna elements. Each of the at least one antenna array that has antenna elements of two polarizations is operatively connected to the switching network via a respective hybrid connector configured to provide a signal from one of the baseband chains to antenna elements of both polarizations.

Advantageously this antenna arrangement enables high flexibility with respect to coverage and capacity when transmitting and receiving signals.

Advantageously this antenna arrangement can be used in a terminal device for steering radiation pattern and baseband resources in different spatial directions, which will increase the coverage and/or capacity for the terminal device.

According to a second aspect there is presented a method for operating an antenna arrangement according to the first aspects for transmission of a signal. The method is performed by a radio transceiver device. The method comprises determining a setting according to which at least one of the baseband chains is operatively connected to the at least two antenna arrays baseband chains via the switching network when transmitting the signal. The method comprises obtaining the signal at the switching network from the at least one of the baseband chains. The method comprises providing the signal to at least one of the at least two antenna arrays in accordance with the setting, thereby transmitting the signal.

According to a third aspect there is presented a radio transceiver device for operating an antenna arrangement according to the first aspects for transmission of a signal. The radio transceiver device comprises processing circuitry. The processing circuitry is configured to cause the radio transceiver device to determine a setting according to which at least one of the baseband chains is operatively connected to the at least two antenna arrays via the switching network when transmitting the signal. The processing circuitry is configured to cause the radio transceiver device to obtain the signal at the switching network from the at least one of the baseband chains. The processing circuitry is configured to cause the radio transceiver device to provide the signal to at least one of the at least two antenna arrays in accordance with the setting, thereby transmitting the signal.

According to a fourth aspect there is presented a radio transceiver device for operating an antenna arrangement according to the first aspects for transmission of a signal. The radio transceiver device comprises processing circuitry and a storage medium. The storage medium stores instructions that, when executed by the processing circuitry, cause the radio transceiver device to perform operations, or steps. The operations, or steps, cause the radio transceiver device to determine a setting according to which at least one of the baseband chains is operatively connected to the at least two antenna arrays via the switching network when transmitting the signal. The operations, or steps, cause the radio transceiver device to obtain the signal at the switching network from the at least one of the baseband chains. The operations, or steps, cause the radio transceiver device to provide the signal to at least one of the at least two antenna arrays in accordance with the setting, thereby transmitting the signal.

According to a fifth aspect there is presented a radio transceiver device for operating an antenna arrangement according to the first aspects for transmission of a signal. The radio transceiver device comprises a determine module configured to determine a setting according to which at least one of the baseband chains is operatively connected to the at least two antenna arrays via the switching network when transmitting the signal. The radio transceiver device comprises an obtain module configured to obtain the signal at the switching network from the at least one of the baseband chains. The radio transceiver device comprises a provide module configured to provide the signal to at least one of the at least two antenna arrays in accordance with the setting, thereby transmitting the signal.

According to a sixth aspect there is presented a computer program for operating an antenna arrangement according to the first aspect for transmission of a signal. The computer program comprises computer program code which, when run on a radio transceiver device, causes the radio transceiver device to perform a method according to the first aspect.

According to a seventh aspect there is presented a method for operating an antenna arrangement according to the first aspects for reception of a signal. The method is performed by a radio transceiver device. The method comprises determining a setting according to which the at least two antenna arrays are to be operatively connected to at least one of the baseband chains via the switching network when receiving the signal. The method comprises obtaining the signal at the switching network from at least one of the at least two antenna arrays. The method comprises providing the signal to the at least one of the baseband chains in accordance with the setting, thereby receiving the signal.

According to an eight aspect there is presented a radio transceiver device for operating an antenna arrangement according to the first aspects for reception of a signal. The radio transceiver device comprises processing circuitry. The processing circuitry is configured to cause the radio transceiver device to determine a setting according to which the at least two antenna arrays are to be operatively connected to at least one of the baseband chains via the switching network when receiving the signal. The processing circuitry is configured to cause the radio transceiver device to obtain the signal at the switching network from at least one of the at least two antenna arrays. The processing circuitry is configured to cause the radio transceiver device to provide the signal to the at least one of the baseband chains in accordance with the setting, thereby receiving the signal.

According to a ninth aspect there is presented a radio transceiver device for operating an antenna arrangement according to the first aspects for reception of a signal. The radio transceiver device comprises processing circuitry and a storage medium. The storage medium stores instructions that, when executed by the processing circuitry, cause the radio transceiver device to perform operations, or steps. The operations, or steps, cause the radio transceiver device to determine a setting according to which the at least two antenna arrays are to be operatively connected to at least one of the baseband chains via the switching network when receiving the signal. The operations, or steps, cause the radio transceiver device to obtain the signal at the switching network from at least one of the at least two antenna arrays. The operations, or steps, cause the radio transceiver device to provide the signal to the at least one of the baseband chains in accordance with the setting, thereby receiving the signal.

According to a tenth aspect there is presented a radio transceiver device for operating an antenna arrangement according to the first aspects for reception of a signal. The radio transceiver device comprises a determine module configured to determine a setting according to which the at least two antenna arrays are to be operatively connected to at least one of the baseband chains via the switching network when receiving the signal. The radio transceiver device comprises an obtain module configured to obtain the signal at the switching network from at least one of the at least two antenna arrays. The radio transceiver device comprises a provide module configured to provide the signal to the at least one of the baseband chains in accordance with the setting, thereby receiving the signal.

According to an eleventh aspect there is presented a computer program for operating an antenna arrangement according to the first aspect for transmission of a signal, the computer program comprising computer program code which, when run on a radio transceiver device, causes the radio transceiver device to perform a method according to the seventh aspect.

According to a twelfth aspect there is presented a computer program product comprising a computer program according to at least one of the sixth aspect and the eleventh aspect, and a computer readable storage medium on which the computer program is stored. The computer readable storage medium could be a non-transitory computer readable storage medium.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 2:
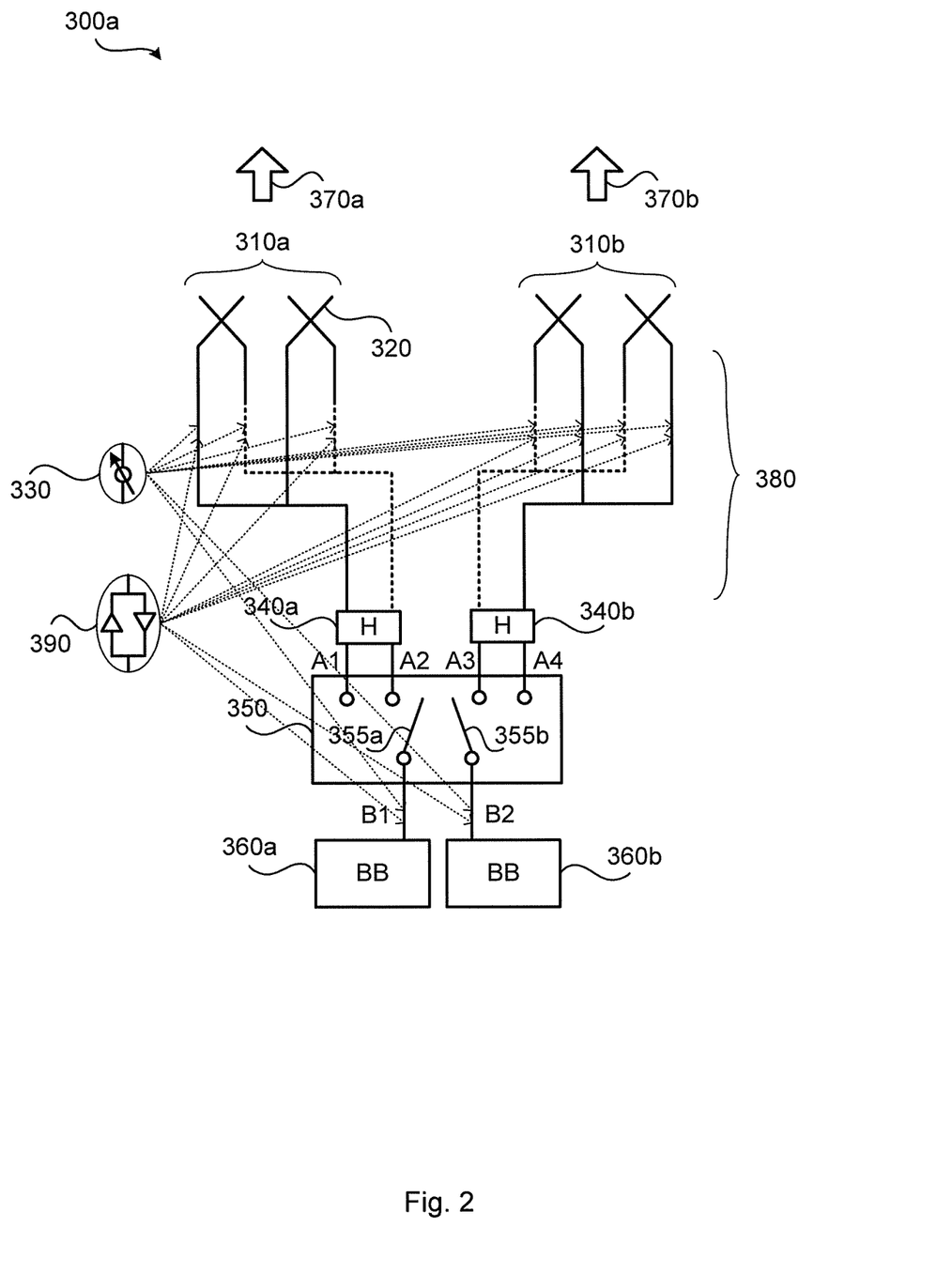
FIGS. 2 and 3 schematically illustrate antenna arrangements according to embodiments.

FIG. 2 illustrates an embodiment of an antenna arrangement 300a for a radio transceiver device 200 according to an embodiment. The antenna arrangement 300a comprises two baseband chains 360a, 360b and two antenna arrays 310a, 310b with antenna elements 320 of two polarizations. The antenna elements 320 of one polarization at each of the antenna arrays 310a, 310b define its own set of antenna elements. Each of the antenna arrays 310a, 310b comprises antenna elements of two polarizations, and thus comprises two sets of antenna elements each. With two sets of antenna elements for each antenna array 310a, 310b there is thus four sets of antenna elements in total in the antenna arrangement 300a.

In the antenna arrangement 300a of FIG. 2 the two antenna arrays 310a, 310b have the same pointing direction, as symbolized by arrows 370a, 370b. But as will be further disclosed below, in other examples at least two antenna arrays 310a, 310b have mutually different pointing directions.

The antenna arrays 310a, 310b are operatively connected to baseband chains 360a, 360b via a switching network 350, where B1, B2, . . . mark interfaces of the switching network 350 at the baseband side, and where A1, A2, . . . mark interfaces of the switching network 350 at the array side.

Each of the antenna arrays 310a, 310b could, for each polarization, comprise an analog distribution network 380 to which the switching network 350 is operatively connected. The analog distribution network 380 thus connects the individual antenna elements 320 to the switching network 350.

At the array side the switching network 350 is operatively connected to the antenna arrays 310a, 310b via hybrid (H) connectors 340a, 340b. Each output of the hybrid connector 340a, 340b at the array side provides a signal from one of the baseband chains 360a, 360b to antenna elements 320 of both polarizations. Each output of a respective hybrid connector 340a, 340b at the array side is thus connected to a respective analog distribution network 380 serving antenna elements 320 of one polarization of one antenna array 310a, 310b.

The switching network 350 comprises as many switches 355a, 355b as there are baseband chains 360a, 360b such that each baseband chain 360a, 360b can be operatively connected to a respective one of the at least two antenna arrays 310a, 310b. The switching network 350 thus provides baseband-to-array connections. Generally, only one of the baseband chains 360a, 360b needs to be operatively connected to one of the antenna arrays 310a, 310b in order for a signal to be transmitted or received by the antenna arrangement 300a. By means of the switching network 350 it is possible to configure baseband-to-array connections in different ways depending on how the switches 355a, 355b are set.

According to a first example, the switches 355a, 355b are set so as connect B1 with A1 and B2 with A2. Both baseband chains 360a, 360b are thus connected to antenna array 310a. This setting can be useful, for example, if the radio transceiver device 200 is communicating with a TRP that is located in the same direction as this antenna array 310a is pointing in.

According to a second example, the switches 355a, 355b are set so as connect B1 with A3 and B2 with A4. This setting is similar to the first example with the difference that both baseband chains 360a, 360b are connected to antenna array 310b.

According to a second example, the switches 355a, 355b are set so as connect B1 with A1 and B2 with A4. Each baseband chain 360a, 360b is thus connected to all antenna elements of its own antenna array 310a, 310b through a respective one of the hybrid connectors 340a, 340b. By using the hybrid connectors 340a, 340b, the signal of each baseband chain 360a, 360b will be provided to all antenna elements (of both polarizations) of a respective antenna array 310a, 310b, which enables so-called dual-polarized beamforming within each panel antenna array 310a, 310b. By using dual-polarized beamforming, almost arbitrarily beam widths could be attained for each respective antenna array 310a, 310b, which will improve the transmission and reception performance of the radio transceiver device 200. Details of dual-polarized beamforming are provided in documents WO2011/050866 A1 and WO2016141961 A1.

As will be further disclosed below, the antenna arrangement 300a could further comprise power amplifiers and/or low noise amplifiers 390 and phase shifters 330.

The antenna arrangement 300a of FIG. 2 is for simplicity illustrated to only comprise two antenna arrays 310a, 310b with two antenna elements 320 each and comprising two baseband chains 360a, 360b. Any number of antenna arrays 310a, 310b, antenna elements 320, and baseband chains 360a, 360b can be used, and the antenna arrays 310a, 310b could be either one-dimensional or two-dimensional antenna arrays.

Figure 3:
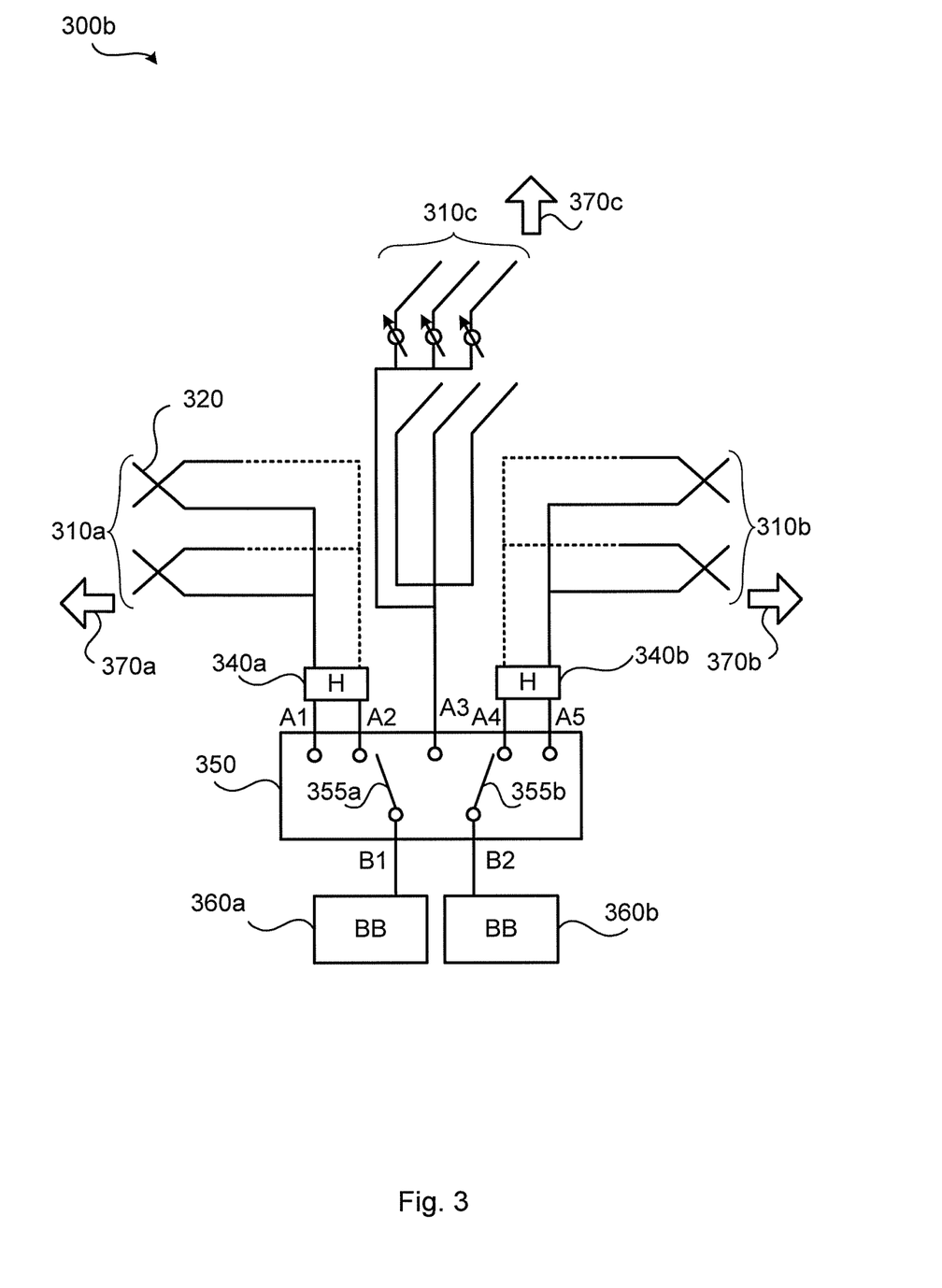

FIG. 3 illustrates an embodiment of an antenna arrangement 300b for a radio transceiver device 200 according to another embodiment. The antenna arrangement 300b is similar to the antenna arrangement 300a and thus comprises two baseband chains 360a, 360b, a switching network 350 with switches 355*a*, 355*b*, and hybrid connectors 240*a*, 340*b*. The antenna arrangement 300*b* comprises three antenna arrays 310*a*, 310*b*, 310*c*, all of which having mutually different pointing directions 370*a*, 370*b*, 370*c*. Further, whilst antenna arrays 310*a*, 310*b* have antenna elements 320 of two polarizations, antenna array 310*c* has antenna elements 320 of one polarization.

In view of the embodiments illustrated in FIGS. 2 and 3 there is thus provided an antenna arrangement 300*a*, 300*b* for a radio transceiver device 200. The antenna arrangement 300*a*, 300*b* comprises at least two antenna arrays 310*a*, 310*b*, 310*c*. At least one of the at least two antenna arrays 310*a*, 310*b*, 310*c* has antenna elements 320 of two polarizations. The antenna elements 320 of one polarization at each of the at least two antenna arrays 310*a*, 310*b*, 310*c* define a respective set of antenna elements 320.

The antenna arrangement 300*a*, 300*b* further comprises at least two baseband chains 360*a*, 360*b*. In some aspects the antenna arrangement 300*a*, 300*b* comprises precisely two baseband chains 360*a*, 360*b*. Examples of switching networks 350 enabling the antenna arrangements to have more than two baseband chains 360*a*, 360*b* will be disclosed below.

The antenna arrangement 300*a*, 300*b* thus further comprises a switching network 350. The switching network 350 is configured to selectively operatively connect each of the at least two baseband chains 360*a*, 360*b* with its own set of antenna elements 320 such that no two baseband chains 360*a*, 360*b* are operatively connected to one and the same set of antenna elements 320. In other words, the baseband chains 360*a*, 360*b* are operatively connected to the antenna arrays 310*a*, 310*b* such that the baseband chains 360*a*, 360*b* do not share the same set of antenna elements 320 (where a set of antenna elements 320 is defined as above).

Each of the at least one antenna array 310*a*, 310*b*, 310*c* having antenna elements 320 of two polarizations is operatively connected to the switching network 350 via a respective hybrid connector 340*a*, 340*b*. The hybrid connectors 340*a*, 340*b* are configured to provide a signal from one of the baseband chains 360*a*, 360*b* to antenna elements 320 of both polarizations.

Further aspects and embodiments relating to the antenna arrangement 300*a*, 300*b* will now be disclosed with parallel reference to the antenna arrangements 300*a*, 300*b* of FIGS. 2 and 3.

In case the baseband chains 360*a*, 360*b* are operatively connected to different sets of antenna elements 320 at one and the same antenna array, a signal transmitted from one of the baseband chains could be subjected to the inverse operations of the hybrid connector before being transmitted through the hybrid connector such as to cancel the effect of the hybrid connector and such that the signal from each baseband chain 360*a*, 360*b* reaches a separate set of antenna elements 320 at the antenna array. Another alternative could be to selectively bypass the hybrid connectors 340*a*, 340*b* when the baseband chains 360*a*, 360*b* are operatively connected to different sets of antenna elements 320 at one and the same antenna array.

Aspects relating to configurations of the antenna arrays 310*a*, 310*b*, 310*c* will now be disclosed.

There could be different number of antenna arrays 310*a*, 310*b*, 310*c*. In some aspects there are only two antenna arrays 310*a*, 310*b*, 310*c*. In some embodiments the antenna arrangement 300*a*, 300*b* comprises precisely two antenna arrays 310*a*, 310*b*, where both antenna arrays 310*a*, 310*b* have antenna elements 320 of two polarizations. The antenna arrangement 300*a* of FIG. 2 is an example of such an embodiment. In some embodiments the antenna arrangement 300*a*, 300*b* comprises a single antenna array 310*a*, 310*b* having antenna elements 320 of two polarizations and a single antenna array 310*c* having antenna elements 320 of one polarization.

The antenna arrays 310*a*, 310*b*, 310*c* might be one-dimensional or two-dimensional. In the examples of FIGS. 2 and 3, antenna arrays 310*a*, 310*b* are one-dimensional whilst antenna array 310*c* is two-dimensional. That is, according to an embodiment the antenna arrangement 300*a*, 300*b* comprises only one-dimensional antenna arrays or two-dimensional antenna arrays. In this respect the antenna arrangement 300*a* FIG. 2 is an example of an embodiment where the antenna arrangement 300*a* comprises only one-dimensional antenna arrays 310*a*, 310*b*. According to another embodiment the antenna arrangement 300*a*, 300*b* comprises a mix of at least one one-dimensional antenna array 310*c* and at least one two-dimensional antenna array 310*a*, 310*b*. In this respect the antenna arrangement 300*a* FIG. 3 is an example of such an embodiment.

As disclosed above, each of the at least two antenna arrays 310*a*, 310*b*, 310*c* has a pointing direction 370*a*, 370*b*, 370*c*. The antenna arrays 310*a*, 310*b*, 310*c* might point in the same direction or point in at least two directions. That is, according to an embodiment the at least two antenna arrays 310*a*, 310*b*, 310*c* collectively has at least two mutually different pointing directions. In this respect the antenna arrangement 300*b* of FIG. 3 is an example of an embodiment where the antenna arrays 310*a*, 310*b*, 310*c* point in three mutually different directions, according to the arrows 370*a*, 370*b*, 370*c*.

As disclosed above, in some aspects each of the at least two antenna arrays 310*a*, 310*b*, 310*c* for each polarization comprises an analog distribution network 380 to which the switching network 350 is operatively connected.

As disclosed above, in some aspects the antenna arrangement 300*a*, 300*b* comprises phase shifters 330. There could be different placements of the phase shifters 330 in the antenna arrangements 300*a*, 300*b*.

In some aspects the phase shifters 330 are placed close to the antenna elements 320. Thus, according to an embodiment each antenna element 320 has its own phase shifter 330. In this respect the phase shifters 330 could be part of the analog distribution network 380.

In other aspects the phase shifters 330 are placed close to the baseband. Thus, according to an embodiment the phase shifters 330 are operatively connected between the switching network 350 and the least two baseband chains 360*a*, 360*b* such that there is one phase shifter 330 per baseband chain 360*a*, 360*b*.

As disclosed above, in some aspects the antenna arrangement 300*a*, 300*b* comprises power amplifiers and/or low noise amplifiers 390. There could be different placements of the power amplifiers and/or low noise amplifiers 390 in the antenna arrangements 300*a*, 300*b*.

In some aspects the power amplifiers and/or low noise amplifiers 390 are placed close to the antenna elements 320. Thus, according to an embodiment each antenna element 320 has its own power amplifier and/or low noise amplifier 390. In this respect the power amplifiers and/or low noise amplifiers 390 could be part of the analog distribution network 380.

In other aspects the power amplifiers and/or low noise amplifiers 390 are placed close to the baseband. Thus, according to an embodiment the power amplifiers and low noise amplifiers 390 are operatively connected between the switching network 350 and the least two baseband chains 360a, 360b such that there is one power amplifier and/or low noise amplifier per baseband chain 360a, 360b.

Possible placements of the phase shifters 330, and power amplifiers and/or low noise amplifiers 390 have been indicated by arrows in FIG. 2. For simplicity, and to avoid cluttering in the drawings, the antenna arrangement 300b has in FIG. 3 been illustrated without any phase shifters, power amplifiers, and low noise amplifiers.

Figure 4:
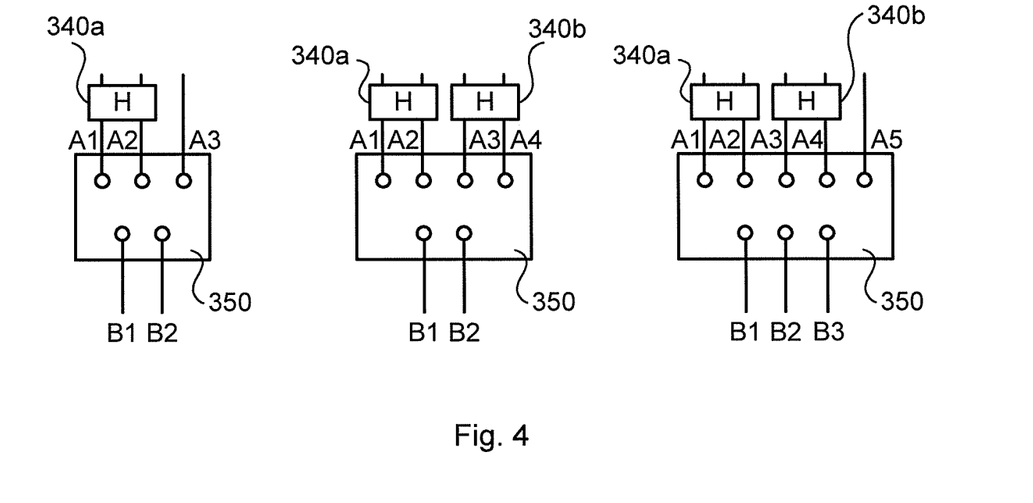
FIG. 4 schematically illustrates switching networks according to embodiments.

FIG. 4 schematically illustrates different embodiments of the switching network 350. As disclosed above, the switching network 350 comprises as many switches as there are baseband chains. However, for simplicity, the switching networks 350 have in FIG. 4 been illustrated without switches.

The embodiment of FIG. 4(a) comprises three interfaces A1, A2, A3 at the array side and two interfaces B1, B2 at the baseband side. Two of the interfaces A1, A2 are connected to a hybrid connector 340a. The embodiment of FIG. 4(a) is thus configured for an antenna arrangement having two baseband chains, one antenna arrays with antenna elements of two polarizations, and one antenna array with antenna elements of one polarization.

The embodiment of FIG. 4(b) comprises four interfaces A1, A2, A3, A4 at the array side and two interfaces B1, B2 at the baseband side. Two pairs of the interfaces (where A1, A2 forms one pair and A3, A4 forms another pair) are each connected to a respective hybrid connector 340a, 340b. The embodiment of FIG. 4(b) is thus configured for an antenna arrangement having two baseband chains, and two antenna arrays with antenna elements of two polarizations.

The embodiment of FIG. 4(c) comprises five interfaces A1, A2, A3, A4, A5 at the array side and three interfaces B1, B2, B3 at the baseband side. Two pairs of the interfaces (where A1, A2 forms one pair and A3, A4 forms another pair) are each connected to a respective hybrid connector 340a, 340b. The embodiment of FIG. 4(b) is thus configured for an antenna arrangement having three baseband chains, two antenna arrays with antenna elements of two polarizations, and one antenna array with antenna elements of one polarization.

There could be different examples of radio transceiver devices 200 in which the herein disclosed antenna arrangements 300a, 300b could be provided. According to an embodiment the radio transceiver device 200 is a terminal device. Hence, in some aspects there is disclosed a radio transceiver device 200 comprising an antenna arrangement 300a, 300b as herein disclosed. The terminal device could, for example, be a portable wireless device, mobile station, mobile phone, handset, wireless local loop phone, user equipment (UE), smartphone, laptop computer, tablet computer, wireless modem, network equipped vehicle, network equipped sensor, or an Internet of Things (IoT) device.

Figure 5:
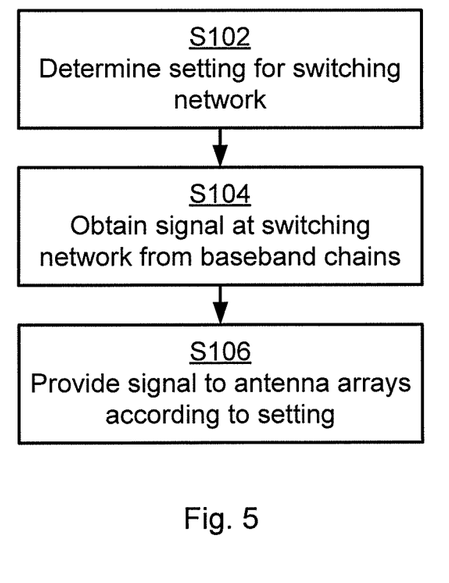
FIGS. 5 and 6 are flowcharts of methods according to embodiments.

Reference is now made to FIG. 5 illustrating a method for operating any of the above disclosed antenna arrangements 300a, 300b for transmission of a signal as performed by the radio transceiver device 200 according to an embodiment.

The antenna arrangement 300a, 300b is configured according to how the signal is to be transmitted from the at least two antenna arrays 310a, 310b, 310c. Thus, the radio transceiver device 200 is configured to perform step S102:

S102: The radio transceiver device 200 determines a setting according to which at least one of the baseband chains 360a, 360b is operatively connected to a respective one of the at least two antenna arrays 310a, 310b, 310c via the switching network 350 when transmitting the signal. In this respect, the conditions as defined above for how to operatively the antenna arrays 310a, 310b, 310c and the baseband chains 360a, 360b still apply. Particularly, no two baseband chains 360a, 360b are operatively connected to one and the same set of antenna elements. In one extreme case only a single baseband chain is operatively connected to a single one of the set of antennas. In the other extreme case each baseband chain is operatively connected to a respective one of the antenna arrays. The setting could define how the switches 355a, 355a of the switching network 350 are set.

Once the switching network 350 has been properly set, the signal to be transmitted can be passed from the baseband side to the array side for transmission. Thus, the radio transceiver device 200 is configured to perform steps S104, S106:

S104: The radio transceiver device 200 obtains the signal at the switching network 350 from the at least one of the baseband chains 360a, 360b.

S106: The radio transceiver device 200 provides the signal to at least one of the at least two antenna arrays 310a, 310b, 310c in accordance with the setting. The signal is thereby transmitted.

Figure 6:
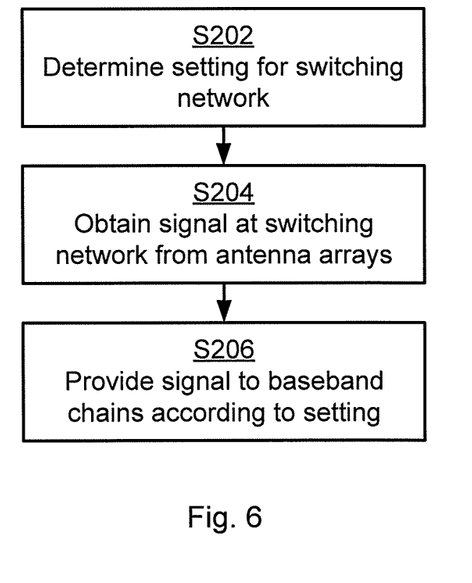

Reference is now made to FIG. 6 illustrating a method for operating any of the above disclosed antenna arrangements 300a, 300b for reception of a signal as performed by the radio transceiver device 200 according to an embodiment.

The antenna arrangement 300a, 300b is configured according to how the signal is to be received by the baseband chains 360a, 360b. Thus, the radio transceiver device 200 is configured to perform step S202:

S202: The radio transceiver device 200 determines a setting according to which the at least two antenna arrays 310a, 310b, 310c are to be operatively connected to at least one of the baseband chains 360a, 360b via the switching network 350 when receiving the signal. In this respect, the conditions as defined above for how to operatively the antenna arrays 310a, 310b, 310c and the baseband chains 360a, 360b still apply. Particularly, no two baseband chains 360a, 360b are operatively connected to one and the same set of antenna elements. In one extreme case only a single baseband chain is operatively connected to a single one of the set of antennas. In the other extreme case each baseband chain is operatively connected to a respective one of the antenna arrays. The setting could define how the switches 355a, 355a of the switching network 350 are set.

Once the switching network 350 has been properly set, the signal to be received can be passed from the array side to the baseband side for reception. Thus, the radio transceiver device 200 is configured to perform steps S204, S206:

S204: The radio transceiver device 200 obtains the signal at the switching network 350 from at least one of the at least two antenna arrays 310a, 310b, 310c.

S306: The radio transceiver device 200 provides the signal to the at least one of the baseband chains 360a, 360b in accordance with the setting. The signal is thereby received.

Figure 7:
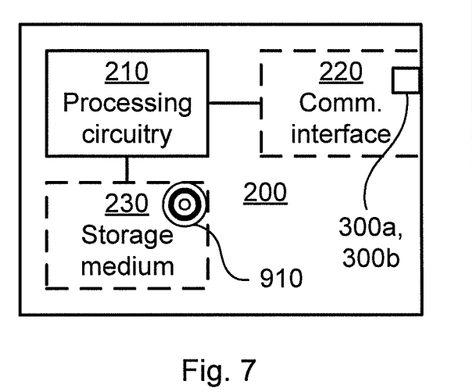
FIG. 7 is a schematic diagram showing functional units of a radio transceiver device according to an embodiment.

FIG. 7 schematically illustrates, in terms of a number of functional units, the components of a radio transceiver device 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 310 (as in FIG. 9), e.g. in the form of a storage medium 230. The processing circuitry 210 may further be provided as at least one application specific integrated circuit (ASIC), or field programmable gate array (FPGA).

Particularly, the processing circuitry 210 is configured to cause the radio transceiver device 200 to perform a set of operations, or steps, S102-S106, S202-S206, as disclosed above. For example, the storage medium 230 may store the set of operations, and the processing circuitry 210 may be configured to retrieve the set of operations from the storage medium 230 to cause the radio transceiver device 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The radio transceiver device 200 may further comprise a communications interface 220. The communications interface 220 could comprise an antenna arrangement 300a, 300b as herein disclosed.

The processing circuitry 210 controls the general operation of the radio transceiver device 200 e.g. by sending data and control signals to the communications interface 220 and the storage medium 230, by receiving data and reports from the communications interface 220, and by retrieving data and instructions from the storage medium 230. Other components, as well as the related functionality, of the radio transceiver device 200 are omitted in order not to obscure the concepts presented herein.

Figure 8:
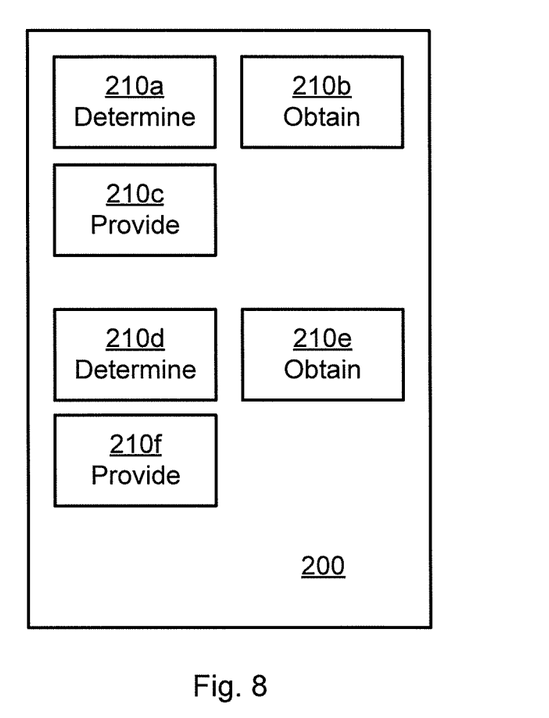
FIG. 8 is a schematic diagram showing functional modules of a radio transceiver device according to an embodiment.

FIG. 8 schematically illustrates, in terms of a number of functional modules, the components of a radio transceiver device 200 according to an embodiment. In some aspects the radio transceiver device 200 of FIG. 8 comprises a first determine module 210a configured to perform step S102, a first obtain module 210b configured to perform step S104, and a first provide module 210C configured to perform step S106. In some aspects the radio transceiver device 200 of FIG. 8 comprises a second determine module 210d configured to perform step S202, a second obtain module 210e configured to perform step S204, and a second provide module 210f configured to perform step S206.

In general terms, each functional module 210a-210f may in one embodiment be implemented only in hardware and in another embodiment with the help of software, i.e., the latter embodiment having computer program instructions stored on the storage medium 230 which when run on the processing circuitry makes the radio transceiver device 200 perform the corresponding steps mentioned above in conjunction with FIG. 8. It should also be mentioned that even though the modules correspond to parts of a computer program, they do not need to be separate modules therein, but the way in which they are implemented in software is dependent on the programming language used. Preferably, one or more or all functional modules 210a-210f may be implemented by the processing circuitry 210, possibly in cooperation with the communications interface 220 and/or the storage medium 230. The processing circuitry 210 may thus be configured to from the storage medium 230 fetch instructions as provided by a functional module 210a-210f and to execute these instructions, thereby performing any steps as disclosed herein.

Figure 9:
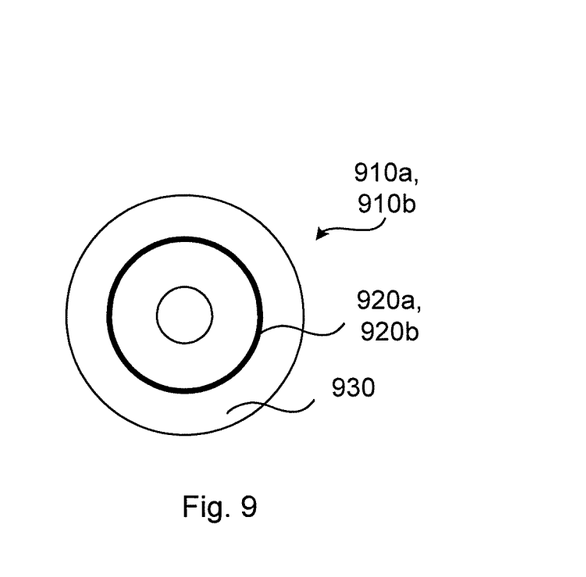
FIG. 9 shows one example of a computer program product comprising computer readable storage medium according to an embodiment.

FIG. 9 shows one example of a computer program product 910a, 910b comprising computer readable storage medium 930. On this computer readable storage medium 930, a computer program 920a, 920b can be stored, which computer program 920a, 920b can cause the processing circuitry 210 and thereto operatively coupled entities and devices, such as the communications interface 220 and the storage medium 230, to execute methods according to embodiments described herein. The computer program 920a, 920b and/or computer program product 910a, 910b may thus provide means for performing any steps as herein disclosed.

In the example of FIG. 9, the computer program product 910a, 910b is illustrated as an optical disc, such as a CD (compact disc) or a DVD (digital versatile disc) or a Blu-Ray disc. The computer program product 910a, 910b could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 920a, 920b is here schematically shown as a track on the depicted optical disk, the computer program 920a, 920b can be stored in any way which is suitable for the computer program product 910a, 910b.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. An antenna arrangement for a radio transceiver device, the antenna arrangement comprising:
   at least two antenna arrays, wherein at least one of the at least two antenna arrays has antenna elements of two polarizations, and wherein the antenna elements of one polarization at each of the at least two antenna arrays define a respective set of antenna elements;
   at least two baseband chains;
   a switching network comprising a number N of switches corresponding to N number of the at least two baseband chains, wherein each switch receives a signal from one of the at least two baseband chains, wherein the switching network is configured to selectively operatively connect each of the at least two baseband chains with its own set of antenna elements such that no two baseband chains are operatively connected to one and the same set of antenna elements; and wherein
   each of the at least one antenna array having antenna elements of two polarizations is operatively connected to the switching network via a respective hybrid connector configured to provide a signal from one of the baseband chains to antenna elements of the at least one antenna array having antenna elements of two polarizations, wherein each respective hybrid connector comprises at least one input port and at least one output port wherein the at least one input port is coupled to the switching network, receiving as input to the hybrid connector the signal from one of the at least two baseband chains.

2. The antenna arrangement according to claim 1, wherein the antenna arrangement comprises only two antenna arrays, both having antenna elements of two polarizations.

3. The antenna arrangement according to claim 1, wherein the antenna arrangement comprises a single antenna array having antenna elements of two polarizations and a single antenna array having antenna elements of one polarization.

4. The antenna arrangement according to claim 1, wherein the antenna arrangement comprises only two baseband chains.

5. The antenna arrangement according to claim 1, wherein the antenna arrangement comprises only one-dimensional antenna arrays or two-dimensional antenna arrays, or wherein the antenna arrangement comprises a mix of at least one one-dimensional antenna array and at least one two-dimensional antenna array.

6. The antenna arrangement according to claim 1, wherein each of the at least two antenna arrays has a pointing direction, and wherein the at least two antenna arrays collectively has at least two mutually different pointing directions.

7. The antenna arrangement according to claim 1, wherein each of the at least two antenna arrays for each polarization comprises an analog distribution network to which the switching network is operatively connected.

8. The antenna arrangement according to claim 1, further comprising:
   power amplifiers and/or low noise amplifiers.

9. The antenna arrangement according to claim 8, wherein each antenna element has its own power amplifier and/or low noise amplifier.

10. The antenna arrangement according to claim 8, wherein the power amplifiers and low noise amplifiers are operatively connected between the switching network and the least two baseband chains such that there is one power amplifier and/or low noise amplifier per baseband chain.

11. The antenna arrangement according to claim 1, further comprising:
    phase shifters.

12. The antenna arrangement according to claim 11, wherein each antenna element has its own phase shifter.

13. The antenna arrangement according to claim 11, wherein the phase shifters are operatively connected between the switching network and the least two baseband chains such that there is one phase shifter per baseband chain.

14. The antenna arrangement according to claim 1, wherein the radio transceiver device is a terminal device.

15. A radio transceiver device comprising the antenna arrangement according to claim 1.

16. A method for operating an antenna arrangement according to claim 1, for transmission of a signal, the method being performed by a radio transceiver device, the method comprising:
   determining a setting according to which at least one of the baseband chains is operatively connected to the at least two antenna arrays baseband chains via the switching network when transmitting the signal;
   obtaining the signal at the switching network from the at least one of the baseband chains; and
   providing the signal to at least one of the at least two antenna arrays in accordance with the setting, thereby transmitting the signal.

17. A method for operating an antenna arrangement according to claim 1, for reception of a signal, the method being performed by a radio transceiver device, the method comprising:
   determining a setting according to which the at least two antenna arrays are to be operatively connected to at least one of the baseband chains via the switching network when receiving the signal;
   obtaining the signal at the switching network from at least one of the at least two antenna arrays; and
   providing the signal to the at least one of the baseband chains in accordance with the setting, thereby receiving the signal.

18. A radio transceiver device for operating an antenna arrangement according to claim 1, for transmission of a signal, the radio transceiver device comprising processing circuitry, the processing circuitry being configured to cause the radio transceiver device to:
   determine a setting according to which at least one of the baseband chains is operatively connected to the at least two antenna arrays via the switching network when transmitting the signal;
   obtain the signal at the switching network from the at least one of the baseband chains; and
   provide the signal to at least one of the at least two antenna arrays in accordance with the setting, thereby transmitting the signal.

19. A radio transceiver device for operating an antenna arrangement according to claim 1, for transmission of a signal, the radio transceiver device comprising:
   processing circuitry; and
   a storage medium storing instructions that, when executed by the processing circuitry, cause the radio transceiver device to:
      determine a setting according to which at least one of the baseband chains is operatively connected to the at least two antenna arrays via the switching network when transmitting the signal;
      obtain the signal at the switching network from the at least one of the baseband chains; and
      provide the signal to at least one of the at least two antenna arrays in accordance with the setting, thereby transmitting the signal.

20. A radio transceiver device for operating an antenna arrangement according to claim 1, for transmission of a signal, the radio transceiver device comprising:
   a determine module configured to determine a setting according to which at least one of the baseband chains is operatively connected to the at least two antenna arrays via the switching network when transmitting the signal;
   an obtain module configured to obtain the signal at the switching network from the at least one of the baseband chains; and
   a provide module configured to provide the signal to at least one of the at least two antenna arrays in accordance with the setting, thereby transmitting the signal.

21. A radio transceiver device for operating an antenna arrangement according to claim 1, for reception of a signal, the radio transceiver device comprising processing circuitry, the processing circuitry being configured to cause the radio transceiver device to:
   determine a setting according to which the at least two antenna arrays are to be operatively connected to at least one of the baseband chains via the switching network when receiving the signal;
   obtain the signal at the switching network from at least one of the at least two antenna arrays; and
   provide the signal to the at least one of the baseband chains in accordance with the setting, thereby receiving the signal.

22. A radio transceiver device for operating an antenna arrangement according to claim 1, for reception of a signal, the radio transceiver device comprising:
   processing circuitry; and
   a storage medium storing instructions that, when executed by the processing circuitry, cause the radio transceiver device to:
      determine a setting according to which the at least two antenna arrays are to be operatively connected to at least one of the baseband chains via the switching network when receiving the signal;

obtain the signal at the switching network from at least one of the at least two antenna arrays; and provide the signal to the at least one of the baseband chains in accordance with the setting, thereby receiving the signal.

23. A radio transceiver device for operating an antenna arrangement according to claim 1, for reception of a signal, the radio transceiver device comprising:

a determine module configured to determine a setting according to which the at least two antenna arrays are to be operatively connected to at least one of the baseband chains via the switching network when receiving the signal;

an obtain module configured to obtain the signal at the switching network from at least one of the at least two antenna arrays; and a provide module configured to provide the signal to the at least one of the baseband chains in accordance with the setting, thereby receiving the signal.

24. A computer program for operating an antenna arrangement according to claim 1, for transmission of a signal, the computer program comprising computer code which, when run on processing circuitry of a radio transceiver device, causes the radio transceiver device to:

determine a setting according to which at least one of the baseband chains is operatively connected to the at least two antenna arrays via the switching network when transmitting the signal;

obtain the signal at the switching network from the at least one of the baseband chains; and provide the signal to at least one of the at least two antenna arrays in accordance with the setting, thereby transmitting the signal.

25. A computer program for operating an antenna arrangement according to claim 1, for reception of a signal, the computer program comprising computer code which, when run on processing circuitry of a radio transceiver device, causes the radio transceiver device to:

determine a setting according to which the at least two antenna arrays are to be operatively connected to at least one of the baseband chains via the switching network when receiving the signal;

obtain the signal at the switching network from at least one of the at least two antenna arrays; and provide the signal to the at least one of the baseband chains in accordance with the setting, thereby receiving the signal.

* * * * *

UNITED STATES PATENT AND TRADEMARK OFFICE
CERTIFICATE OF CORRECTION

PATENT NO. : 10,763,592 B2
APPLICATION NO. : 15/543539
DATED : September 1, 2020
INVENTOR(S) : Petersson et al.

It is certified that error appears in the above-identified patent and that said Letters Patent is hereby corrected as shown below:

In the Specification

In Column 3, Line 58, delete "an eight" and insert -- an eighth --, therefor.

In Column 6, Line 25, delete "so as connect" and insert -- so as to connect --, therefor.

In Column 6, Line 32, delete "so as connect" and insert -- so as to connect --, therefor.

In Column 6, Line 37, delete "so as connect" and insert -- so as to connect --, therefor.

In Column 7, Line 1, delete "hybrid connectors 240a," and insert -- hybrid connectors 340a, --, therefor.

In Column 8, Line 13, delete "300a FIG. 2" and insert -- 300a of FIG. 2 --, therefor.

In Column 8, Lines 19-20, delete "300a FIG. 3" and insert -- 300b of FIG. 3 --, therefor.

In Column 9, Line 36, delete "FIG. 4(b)" and insert -- FIG. 4(c) --, therefor.

In Column 10, Line 8, delete "switches 355a, 355a" and insert -- switches 355a, 355b --, therefor.

In Column 10, Lines 43-44, delete "switches 355a, 355a" and insert -- switches 355a, 355b --, therefor.

In Column 10, Line 52, delete "S306:" and insert -- S206: --, therefor.

In Column 10, Lines 62-63, delete "computer program product 310" and insert -- computer program product 910 --, therefor.

In Column 11, Line 13, delete "one or combination" and insert -- one or more combination --, therefor.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*

In Column 11, Line 34, delete "first provide module 210C" and insert -- first provide module 210c --, therefor.

In the Claims

In Column 12, Line 52, in Claim 1, delete "port wherein" and insert -- port, wherein --, therefor.